(12) United States Patent
Krampotich et al.

(10) Patent No.: US 6,354,601 B1
(45) Date of Patent: Mar. 12, 2002

(54) SEAL FOR WAFER CONTAINERS

(75) Inventors: Dennis J. Krampotich, Shakopee, MN (US); D. Kerry Kiser, Sherwood, OR (US); Michael D. Peterson, Chaska, MN (US)

(73) Assignee: Fluoroware, Inc., Chaska, MN (US)

( * ) Notice: Subject to any disclaimer, the term of this patent is extended or adjusted under 35 U.S.C. 154(b) by 0 days.

(21) Appl. No.: 09/226,427

(22) Filed: Jan. 6, 1999

(51) Int. Cl.[7] .............................................. B65D 85/00
(52) U.S. Cl. ...................... 277/628; 277/630; 277/644; 220/378; 220/795; 206/710
(58) Field of Search .................. 297/628, 630, 297/641, 642, 644, 647; 206/711, 710, 723, 454; 220/784, 786, 788, 795, 378, 4.02, 4.21, 3.8; 49/475.1, 483.1, 484.1, 489.1

(56) References Cited

U.S. PATENT DOCUMENTS

| | | | |
|---|---|---|---|
| 4,434,909 A | * 3/1984 | Ott | ............................. 220/316 |
| 4,804,086 A | 2/1989 | Grohrock | |
| 5,024,329 A | 6/1991 | Grohrock | |
| 5,199,369 A | * 4/1993 | Meyer et al. | ................ 114/117 |
| 5,611,452 A | 3/1997 | Bonora | ........................ 220/378 |
| 5,743,424 A | 4/1998 | Murata et al. | |
| 5,971,191 A | * 10/1999 | Yamada et al. | ............. 220/378 |

FOREIGN PATENT DOCUMENTS

DE        826 702    *  1/1952    ................ 220/378

* cited by examiner

*Primary Examiner*—Lynne H. Browne
*Assistant Examiner*—Enoch Peavey
(74) *Attorney, Agent, or Firm*—Patterson, Thuente, Skaar & Christensen, P.A.

(57) ABSTRACT

A wafer container comprising an enclosure portion with a door frame defining an opening for insertion and removal of wafers and a door for insertion into the door frame for closing the opening and sealing with the door frame has an improved elastomeric seal. In a preferred embodiment of the invention an elastomeric seal encircles the door, is partially inset in a groove in the door, and has a cantilevered portion extending laterally outwardly from the door to engage a sealing surface of the door and a laterally displaced sealing surface of the door frame when the door is seated. Thus a seal can be provided that is effected almost totally by flexure of the cantilevered portion rather than by compression of the seal.

9 Claims, 4 Drawing Sheets

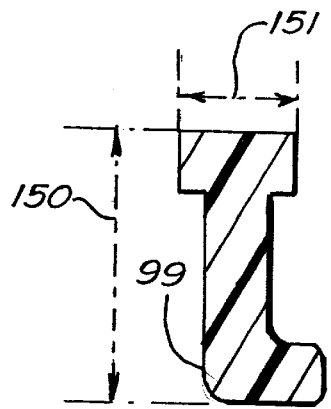
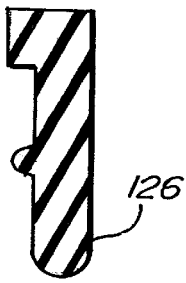
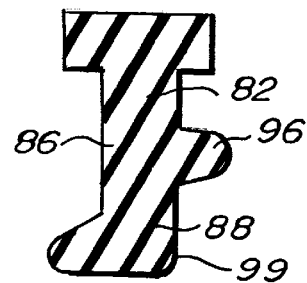
Fig. 9B. Fig. 9C. Fig. 9D.
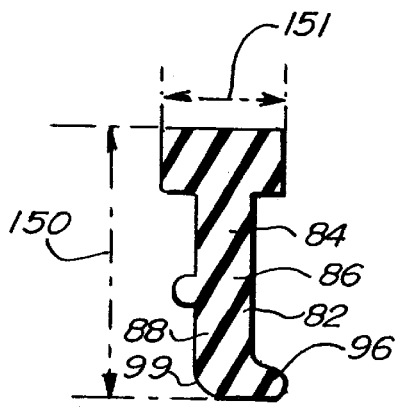
Fig. 9A.

SEAL FOR WAFER CONTAINERS

BACKGROUND OF THE INVENTION

This invention relates to enclosures. More particularly, it relates to sealable enclosure for holding wafers to be manufactured into semiconductors.

Semiconductor wafers are subjected to numerous steps during processing. This usually entails transporting a plurality of wafers from one workstation to another for processing by specialized equipment. As part of the processing procedure, wafers may be temporarily stored or shipped in containers to other plants or to end users. Such intra and extra movements may generate or expose the wafers to potential wafer ruining contaminants. In order to reduce the deleterious effect of contaminants on wafers, specialized containers have been developed to minimize the generation of contaminants and to isolate wafers from contaminants exterior to the containers. A principal feature common to these devices is that they are provided with removable doors or closures which seal or are sealed such as by tape when closed.

As semiconductors have become larger in scale, that is, as the number of circuits per unit area has increased, contaminants in the form particulates have become more of an issue. The size of particulates that can destroy a circuit has decreased and is approaching the molecular level. Particulate control is necessary during all phases of manufacturing, processing, transporting, and storage of semiconductor wafers. The industry is moving toward processing larger and larger wafers into semiconductors. Three hundred millimeter (300 mm) wafers are now commonplace.

Wafer carriers may be made of a variety of materials which in almost all cases comprised thermoplastics. Early containers including, enclosures and closures, were made of highly moldable plastics such as polyethelene, see U.S. Pat. No. 4,248,346, and some held rigid h-bar carriers such as disclosed in U.S. Pat. No. 5,273,159, and some comprise polycarbonate enclosure portions with molded in slots and with softer more resilient covers. See for example U.S. Pat. No. 5,586,658.

Such containers typically relied on an enclosure portion to cover contact for providing the sealing of the container. Other containers, primarily for use within semiconductor fabrication facilities, have both a door to enclosure portion seal and also have the capability to sealingly engage to process equipment. Such container have been termed "SMIF pods" (sealed mechanical interface) where the door closes an open bottom of the container portion, or transport modules, where the door closes an open bottom. These containers are subjected to very demanding structural requirements and performance requirements. For example, they must mechanically latch by robotic or manual means and must of course provide exceptional isolation, such as being hermetically sealable simply by closing the door. For containers for 300 mm wafers that are utilized in fabs, front opening modules are being utilized. Conventional seals for both SMIF pods and transport modules have been relatively simple elastomeric seals that are simply compressed between the door and enclosure portion in an axial direction to provide the seal. As such, the seal contact with the door is aligned with the seal contact with the door frame. Such sealing, particularly where polycarbonate is the contacted by the elastomeric seal, tend to stick excessively and provide inconsistent opening, reduced life expectancy of the seal and inadequate sealing.

A seal is needed for wafer enclosures that is not subjected to direct compression as it seals.

Better performing and longer lasting seals are needed for wafer enclosures.

SUMMARY OF THE INVENTION

A wafer container comprising an enclosure portion with a door frame defining an opening for insertion and removal of wafers and a door for insertion into the door frame for closing the opening and sealing with the door frame has an improved elastomeric seal. In a preferred embodiment of the invention an elastomeric seal encircles the door, is partially inset in a groove in the door, and has a cantilevered portion extending laterally outwardly from the door to engage a sealing surface of the door and a laterally displaced sealing surface of the door frame when the door is seated. Thus a seal can be provided that is effected almost totally by flexure of the cantilevered portion rather than by compression of the seal.

An object and advantage of preferred embodiments of the invention is that a desired sealing force between the door frame and the seal can be easily designed into the cushion by shifting the position of the pedestal portion.

A further object and advantage of preferred embodiments of the invention is that the sealing is not provided by compressing an elastomeric seal, rather it is provided by flexing a cantilevered portion by the insertion of the door.

A further object and advantage of particular embodiments of the invention is that a very soft seal of high integrity is provided which essentially eliminates sticking between the door and door frame.

A further object and advantage of preferred embodiments of the invention is that the seal can be easily replaced when it is worn out or when different sealing characteristics are desired.

BRIEF DESCRIPTION OF THE DRAWINGS

FIG. 9A is a cross sectional view of a seal according to the invention.

FIG. 9B is a cross sectional view of a seal according to an alternate embodiment of the invention.

FIG. 9C is a cross sectional view of a seal according to an alternate embodiment of the invention.

FIG. 9D is a cross sectional view of a seal according to an alternate embodiment of the invention.

DESCRIPTION OF THE PREFERRED EMBODIMENT

Figure 1:
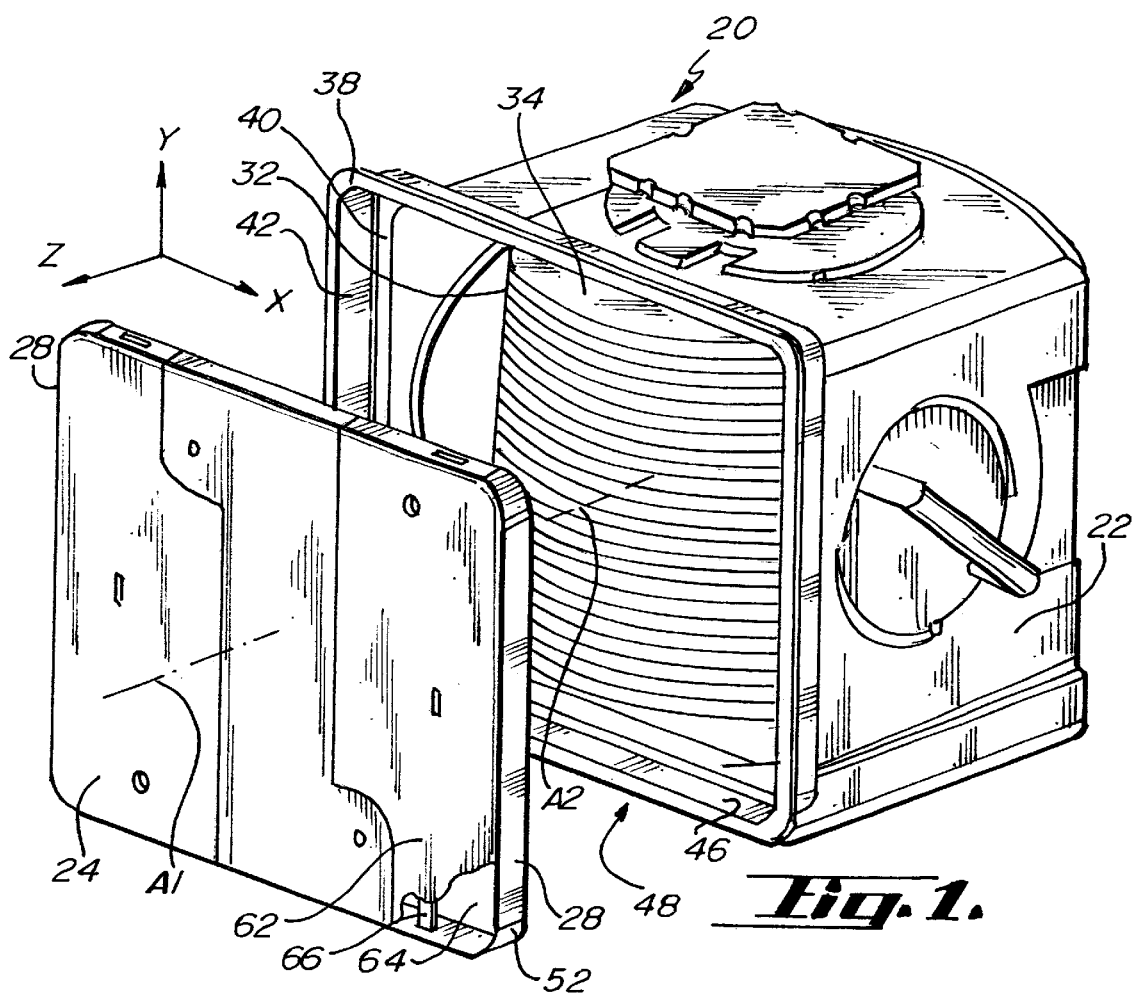
FIG. 1 is a perspective view of a wafer carrier embodying the invention.
Figure 2:
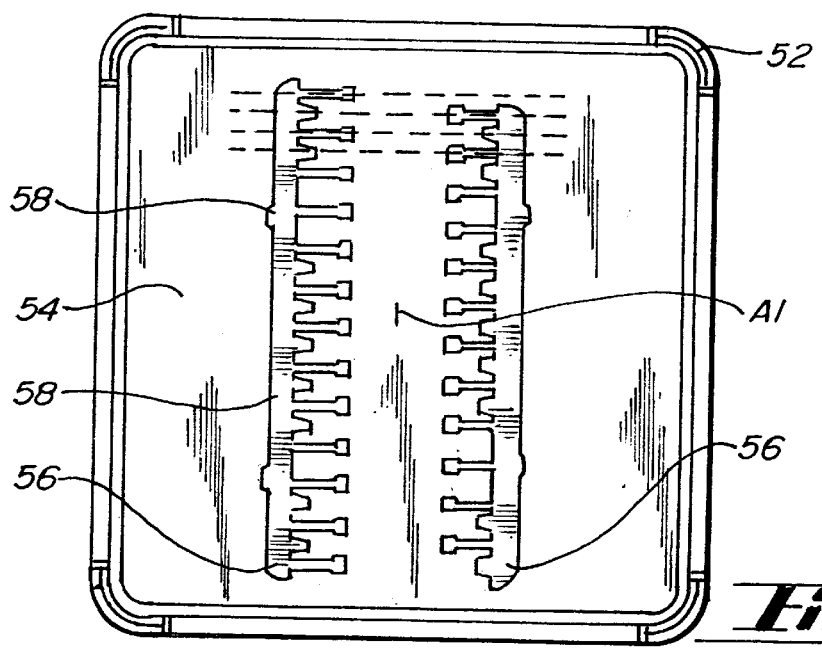
FIG. 2 is a rear elevational view of a door embodying the invention.
Figure 3:
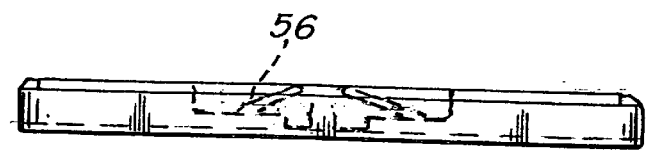
FIG. 3 is a top plan view of a door embodying the invention.
Figure 4:
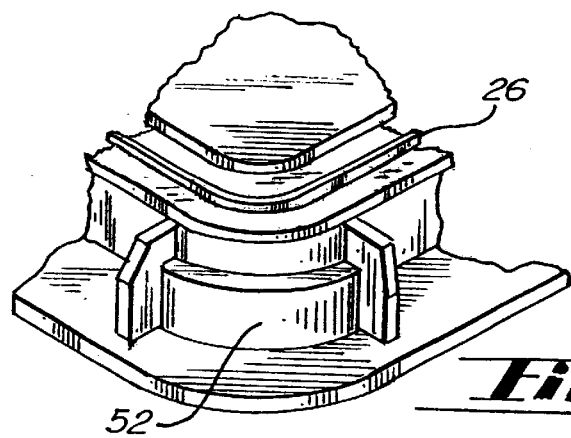
FIG. 4 is a perspective view of a corner of a door embodying the invention.

Referring to FIGS. 1, 2, 3, and 4, a wafer container commonly known as a transport module 20 is illustrated and is principally comprised of an enclosure portion 22 and a door 24. A seal 26 extends around the peripheral portion 28 of the door for sealing engagement with the enclosure portion 22. The enclosure portion has a plurality of slots 32 into which are placed wafers 34 for containment during transportation or storage. Said wafer enclosure has a door frame 38, which in the embodiment of FIG. 1, is configured as a flanged structure shaped for receiving the door. The door frame includes a sealing surface 40, walls 42, and latch receivers 46. When used herein, door frame should not be limited to include a separate structure from the enclosure portion nor additional structure on or integral with the enclosure. Rather door frame is hereby defined to be the portion of the enclosure portion which receives the door. The door frame further defines an opening 48 for insertion and removal of the wafers 34.

The door has an axis A1 and the closure portion has an axis A2. For proper insertion of the door into the door frame axis A1 and A2 should be aligned. When the door is inserted into the door frame, the door thus moves in an axial direction. When "radial" is used herein, it is intended to refer to direction or orientations which are normal to the axis A1 or A2 and can also include, with reference to the seal 26, any directions which are normal to that particular portion of the seal as opposed to a pure vector outwardly from the door axis.

The wafer container 20 utilizes removable door guides 52 on the door to facilitate proper axial alignment of the door with the door frame as well as minimal particle generation for any door-to-door frame contact. On the inside surface 54 of the door are wafer cushions 56 which provide a slightly biased constraint to the wafers when the door is in place. The cushions may be attached suitably at the connection points 58 with plastic snapin connectors. The door enclosure portion may be configured such that the only contact between said components is the seal to door frame engagement and the door guide to door frame contact. Alternatively, supplemental stop portions may be provided in the enclosure portion to allow the door to bottom out when the seal is appropriately flexed. A portion of the exterior door panel 62 is removed in FIG. 1 to disclose the interior space 64 of the door as well as a portion of the latching mechanism 66. Said latching mechanism may operate as disclosed in U.S. Pat. No. 5,711,427 to David L. Nyseth and owned by the owner of the instant invention. Said patent for the purposes of full disclosure is incorporated herein.

Figure 5:
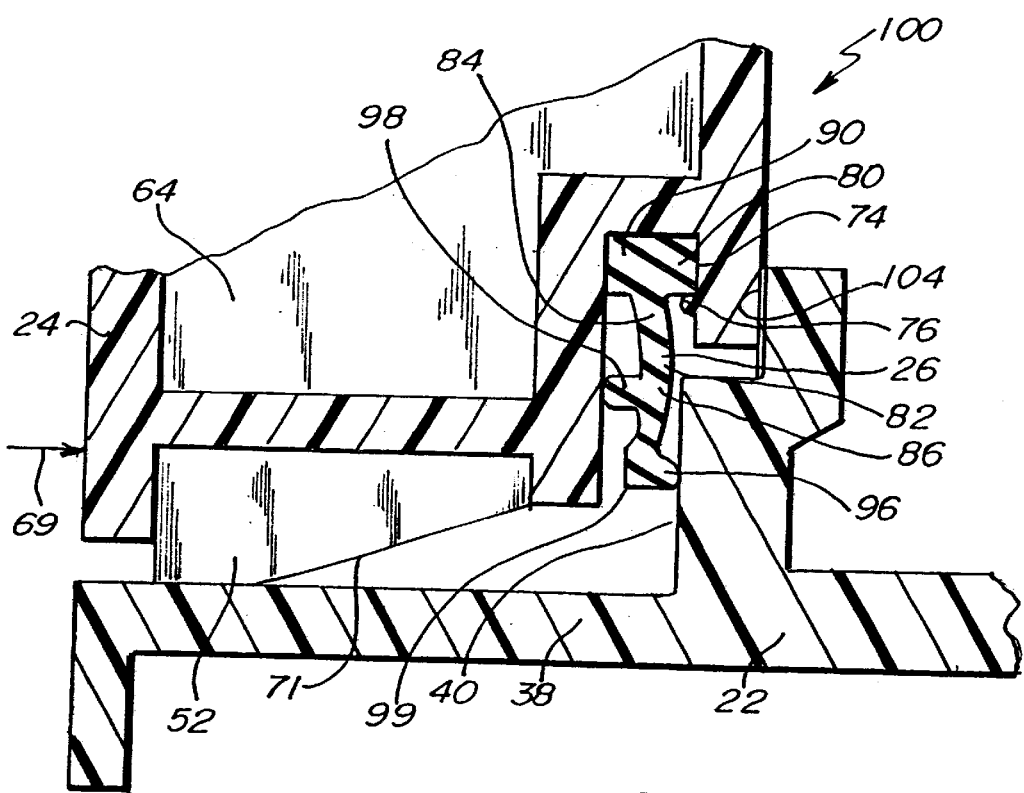
FIG. 5 is a cross sectional view of a portion of a door and door frame embodying the invention.

Referring to FIG. 5, a detailed cross section of a portion of a door and door frame are shown according to the invention herein. The door 24 is inserted in an axial direction as indicated with the arrow enumerated 69. The cammed surfaces 71 on the door guides 52 provide initial and final centering effects for the door in the door frame if needed. The door includes a radially inset groove 74 into which the seal 26 is set. The seal is suitably retained in said groove by structural features such as nubs 76 or the like. Other attachments may be used. The seal in an unstressed state would be as indicated in FIG. 9A and is generally comprised of an inset portion 80 which includes a proximal portion 84 and intermediate portion 86 and a distal portion 88. The inset portion is moreover a fixed portion 90 and the cantilevered portion is similarly a sealing or exposed portion.

Extending from the distal portion 88 of the exposed portion is and opposite side 99 and a first projecting sealing section 96 which projects radially inward protruding in an opposite direction from the intermediate portion 86 is a second protruding section 98 which is shown configured as a pedestal portion. The seal 26 has a greater dimension 150 in a radial direction and a lesser dimension 151 in an axial direction, indicated in FIGS. 9A and 9B.

Figure 6:
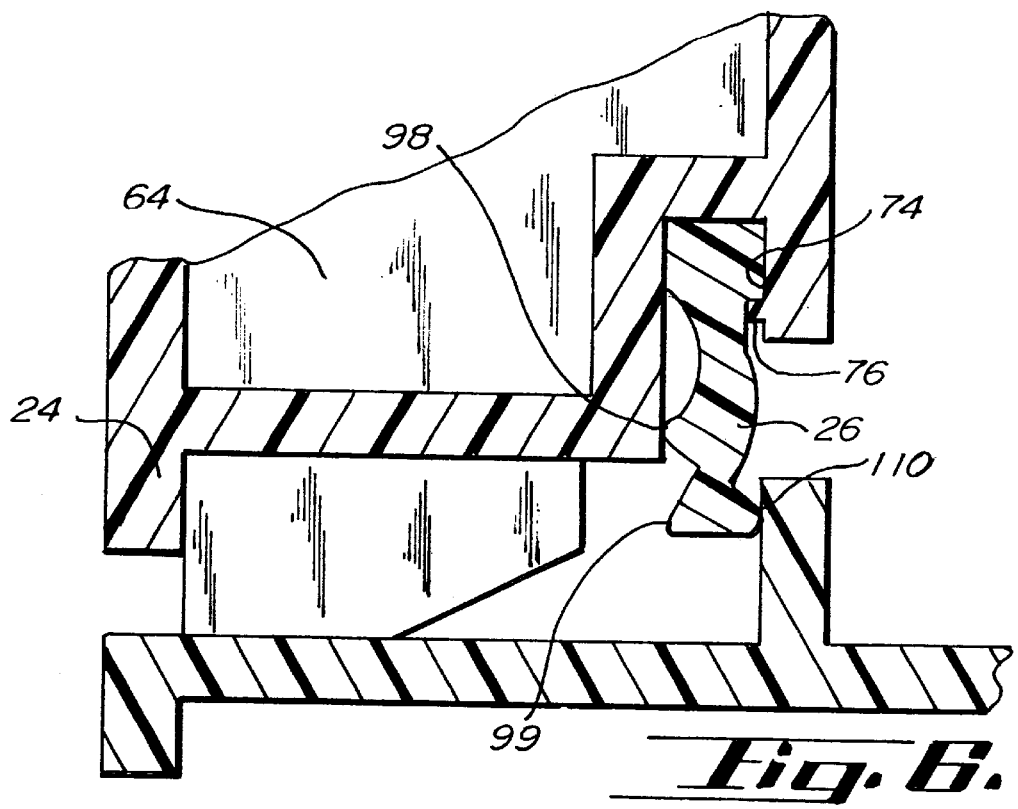
FIG. 6 is a cross sectional view of a portion of a door and a door frame embodying an alternate embodiment of the invention.

Generally, FIG. 5 shows a door and door frame or a door and enclosure juncture 100. The contact between the door and the door enclosure as indicated earlier may be limited to the door guide 52 and the door frame as well as the seal 26. This type of configuration is illustrated in FIG. 6. Alternatively, the door frame may include seating portions 104 onto which rigid portions of the door 24 may seat in an axial direction. Significantly as shown both in FIG. 5 and FIG. 6, the seal is not in any substantial compression; rather the contact between the seal and the door frame causes a deflection of the cantilever portion. The pedestal portion 98 can be suitably sized to minutely control the contact force between the seal and the door frame. Moreover, the contacts between the door seal contacts 106, 108 are radially displaced from the seal enclosure contact 110 in certain embodiments of the invention. The door and seal may be configured to provide some minimal door-to-seal contact that is in radial alignment with the seal to enclosure portion contact 110, such as by the enlarged distal portion of the seal as illustrated by the dashed lines enumerated 112 in FIG. 5.

Figure 7:
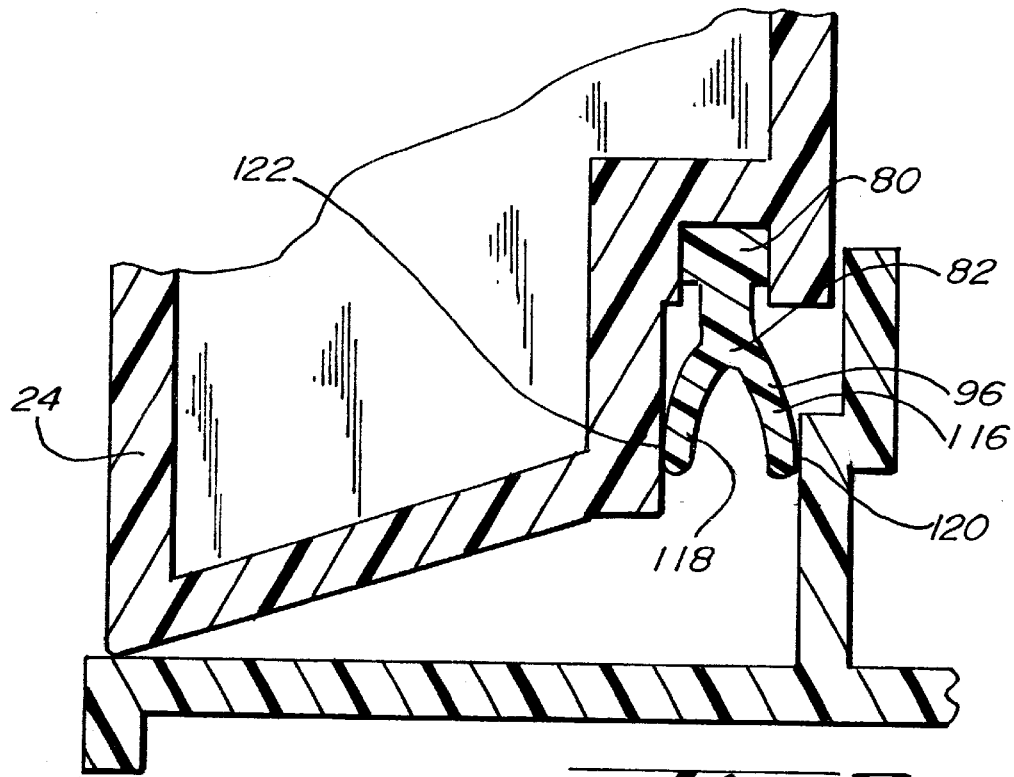
FIG. 7 is a cross sectional view of a portion of a door and a door frame embodying an alternate embodiment of the invention.

An alternative configuration of the seal is shown in FIG. 7. This seal has the inset portion 80 and a cantilevered portion 82 which is branched into a "Y" configuration with two cantilevered branches 116, 118. Each of the cantilevered branches has a contact surface 120, 122 with the door frame and the door respectively. The cantilever branches 116, 118 correspond to the protruding sections shown in FIGS. 5 and 6 and thus consist of a first protruding sealing section 96 and a second protruding section 98. Note that the second protruding sections may or may not be sealing sections in that the principal seal is provided by way of the first protruding section. The second protruding section operates primarily to provide consistent, measured, and precise control of the deflection, and sealing force relative to the first protruding sealing section 96.

Referring to FIGS. 9A, 9B, 9C, and 9D, various other embodiments of the seal are illustrated. The embodiment of FIG. 9B does not have the pedestal portion or the second protruding portion and relies exclusively on the resiliency of the cantilevered portion to provide the desired sealing engagement force. The embodiment of FIG. 9C does not have a first protruding sealing section but rather relies upon the non-protruding surface 126 to seal against the door frame. FIG. 9D illustrates an embodiment in which the first protruding sealing section which engages the door frame extends from the intermediate portion of the cantilevered portion and the second protruding section extends in an opposite direction from the distal portion 88.

In the preferred embodiment, the main structural components of the enclosure portion, particularly the door frame, would be molded of rigid plastic such as polycarbonate. Similarly, the main structural portions of the door, particularly the peripheral portion 28, similarly may be molded from polycarbonate. The wafer guides may suitably be formed of an abrasion resistant composite plastic such as polyetheretherketone (PEEK) and polytetrafluoroethylene (PTFE). The elastomeric seal may be formed of elastomers such as Viton®, available from the Dupont Corporation, or generic ethylenepropylenediene monomer or similar elastomeric materials.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

We claim:

1. A sealable container for containing wafers, the container comprising an enclosure portion with a door frame portion defining a rectangular open side and a rectangular door sized for insertion towards and seating in the door frame thereby closing said open side, the door frame comprising a rectangular outwardly facing flat and radially extending sealing surface and at least one latch receiver, the door comprising an interior facing surface, a parallel exterior facing surface, and four side surfaces intermediate the interior facing side and the exterior facing side, a groove inset in the four sides and extending around said door, an elastomeric seal inserted in the groove and extending around the door, the seal, in cross section, having a greater dimension aligned radially and a lesser dimension aligned axially, an inset portion positioned in the groove and an exposed portion extending outwardly therefrom, the exposed portion having a cross section with a distal portion, the inset portion and exposed portion in substantial alignment in a radial direction, the distal portion having a protruding sealing section with a rounded engagement surface, the protruding sealing section protruding substantially axially toward the enclosure portion, the exposed door frame as the door is inserted into and removed from the door frame by moving axially in a direction transverse to the greater dimension of the seal, the distal portion deflecting axially when the door is seated in the door frame, the side of distal portion opposite the protruding sealing section not being in contact with the door or door frame when the door is seated in the door frame.

2. The wafer enclosure of claim 1, wherein the exposed portion of the seal has an intermediate section with a pedestal portion extending axially in a direction opposite that of the protruding sealing section, the pedestal portion configured for contacting the door thereby providing resistance to the axial deflection of the distal portion.

3. A wafer enclosure, the wafer enclosure comprising an enclosure portion with a door frame, a door with a peripheral portion, and an elastomeric seal for sealing between the door and the door frame, the door engagable into said door frame in an axial direction, the seal comprising an elastomeric seal extending around the peripheral portion of the door, the seal having, in cross section, a greater dimension aligned radially and a lesser dimension aligned axially, the seal comprising a fixed portion fixed to the peripheral portion and a cantilever portion extending laterally from the fixed portion, the fixed portion and the cantilever portion in substantially radial alignment, the cantilever portion comprising a proximal portion, an intermediate portion, and a distal portion, the proximal portion extending laterally outward from the inset portion, the intermediate portion connecting to and integral with the proximal portion, the intermediate portion having a pedestal portion protruding in a direction away from the interior of the enclosure portion, and a distal portion connecting to and integral with the intermediate portion, the distal portion having a contact surface facing toward the enclosure portion, the door engageable with the seal by moving transverse to the greater dimension, whereby when the door is in engagement with the door frame, the contact surface is making sealing engagement with the door frame, the side of distal portion opposite the contact surface not being in contact with the door or the door frame when the door is seated in the door frame.

4. A seal for sealing between an enclosure portion and a door, the enclosure portion having a door frame defining an open side, the door configured to engage with the door frame in a direction into the open side to close the open side forming a door enclosure portion juncture, the seal rectangular in shape, having a greater dimension aligned radially and a lesser dimension aligned axially, and comprising a fixed portion to be attached to one of the door and enclosure portion, the seal further comprising, in cross section, a cantilevered portion extending from the fixed portion in a radial direction, the cantilevered portion including a protruding portion extending in an axial direction for sealingly engaging in an axial direction the other of the door and enclosure portion, the fixed portion and cantilevered portion in substantially radial alignment, the cantilevered portion having a side opposite the protruding portion, the seal configured such that said opposite side does not contact said door or said enclosure portion when the door is engaged in said door frame by moving transverse to the greater dimension of the seal.

5. A method of sealing a wafer container comprising an enclosure portion with an open side and a door having a peripheral portion to close in a direction towards said open side at a door-enclosure portion juncture, the method comprising the steps of:

a) positioning a cantilever seal on the door peripheral portion with the cantilever seal extending radially outward, the cantilever seal having a protruding portion facing axially toward the enclosure portion, a greater dimension aligned radially, a lesser dimension aligned axially, and a fixed portion, the protruding portion and fixed portion in substantially straight alignment, b) moving the door toward the enclosure portion such that the protruding portion makes contact with the enclosure portion in a direction transverse to the greater dimension of the seal, c) further moving the door to flex the cantilever portion in an axial direction substantially without compressing the protruding portion.

6. The method of claim 5, further comprising the step of increasing the sealing force between the protruding portion and the enclosure portion by providing a pedestal portion on the cantilever portion on a side of said cantilevered portion opposite the protruding portion.

7. A method of sealing a wafer container comprising an enclosure portion with a door frame defining an open side and a door having a peripheral portion to close in a direction towards said open side at a door frame-enclosure portion juncture, the method comprising the steps of:

a) positioning a cantilever seal on one of the door peripheral portion and the door frame with the cantilever seal extending radial direction from said one of the door peripheral portion and the door frame, the cantilever seal having a protruding portion facing axially toward the other of the door peripheral portion and the door frame, a greater dimension aligned radially, a lesser dimension aligned axially, and a fixed portion, the protruding portion axially displaced from the fixed portion, b) move the door toward the enclosure portion such that the protruding portion makes contact with the other of the door peripheral portion and the door frame in a direction transverse to the greater dimension of the seal, c) further moving the door to flex the cantilever portion in an axial direction substantially without compressing the protruding portion between the door peripheral portion and the door frame.

8. The method of claim 7, further comprising the step of increasing the sealing force between the protruding portion and the enclosure portion by providing a pedestal portion on the cantilever portion on a side of said cantilevered portion opposite the protruding portion and intermediate the protruding portion and the fixed portion.

9. A wafer enclosure, the wafer enclosure comprising an enclosure portion with a door frame, a door with a peripheral portion, and an elastomeric seal for sealing between the door and the door frame, the door engagable into said door frame in an axial direction, the seal comprising an elastomeric seal extending along one of the peripheral portion of the door and the door frame, the seal having, in cross section, a greater radial dimension and a lesser axial dimension aligned axially, the seal comprising a fixed portion fixed to the one of the peripheral portion of the door and the door frame and a cantilever portion extending radially from the fixed portion, the fixed portion and the cantilever portion in substantially radial alignment, the cantilever portion comprising a proximal portion, an intermediate portion, and a distal portion, the proximal portion extending radially outward from the inset portion, the intermediate portion connecting to and integral with the proximal portion, and a distal portion connecting to and integral with the intermediate portion, the distal portion having a contact surface facing toward the other of the peripheral portion of the door and the door frame, the door engageable with the seal by moving transverse to the greater radial dimension, whereby when the door is in engagement with the door frame, the contact surface is making sealing engagement with the other of the peripheral portion of the door and the door frame, the side of distal portion opposite the contact surface not being in contact with the door or door frame when the door is seated in the door frame.

* * * * *